(12) United States Patent
Kim

(10) Patent No.: US 12,148,460 B2
(45) Date of Patent: Nov. 19, 2024

(54) SEMICONDUCTOR MEMORY DEVICE INCLUDING REFRESH CONTROL CIRCUIT WITH DUAL REFRESH RATE AND MEMORY SYSTEM

(71) Applicant: SK hynix Inc., Icheon-si (KR)

(72) Inventor: Kyung Mook Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 256 days.

(21) Appl. No.: 17/871,636

(22) Filed: Jul. 22, 2022

(65) Prior Publication Data

US 2023/0290399 A1 Sep. 14, 2023

(30) Foreign Application Priority Data

Mar. 10, 2022 (KR) ........................ 10-2022-0030039

(51) Int. Cl.
*G11C 11/406* (2006.01)
*G11C 11/4072* (2006.01)

(52) U.S. Cl.
CPC ........ *G11C 11/406* (2013.01); *G11C 11/4072* (2013.01)

(58) Field of Classification Search
CPC .............. G11C 11/406; G11C 11/4072; G11C 11/40622; G11C 11/40611; G11C 11/4085; G11C 8/18
See application file for complete search history.

(56) References Cited

U.S. PATENT DOCUMENTS

| 7,930,471 | B2 | 4/2011 | Walker | |
|---|---|---|---|---|
| 2002/0051389 | A1* | 5/2002 | Mizugaki | G11C 8/08 365/200 |
| 2010/0302889 | A1* | 12/2010 | Sawamura | G11C 11/406 365/230.03 |
| 2014/0112086 | A1* | 4/2014 | Park | G11C 11/40618 365/222 |
| 2014/0219042 | A1 | 8/2014 | Yu et al. | |

* cited by examiner

*Primary Examiner* — Sultana Begum

(57) ABSTRACT

A semiconductor memory device includes a refresh counter generating a counting address that is sequentially increasing according to a refresh command; an active latch generating an active address corresponding to an input address according to an active command; and a refresh control circuit repeatedly performing a first refresh period and a second refresh period according to the refresh command, and controlling selective refresh of one or more word lines corresponding to the counting address selected based on one or more high bits of the active address during the first refresh period and controlling sequential refresh of the word lines corresponding to the counting address during the second refresh period.

24 Claims, 16 Drawing Sheets

FIG. 12A

| CADD ||||||||||||| WL | Operation |
| 12 | 11 | 10 | 9 | 8 | 7 | 6 | 5 | 4 | 3 | 2 | 1 | | |
| 0 | 0 | 0 | 0 | 0 | 0 | 0 | 0 | 0 | 0 | 0 | 0 | 0 | SKIP |
| 0 | 0 | 0 | 0 | 0 | 0 | 0 | 0 | 0 | 0 | 0 | 1 | 1 | SKIP |

FIG. 12B

| | 12 | 11 | 10 | 9 | 8 | 7 | 6 | 5 | 4 | 3 | 2 | 1 | WL | Operation |
|---|---|---|---|---|---|---|---|---|---|---|---|---|---|---|
| IADD | 0 | 0 | 0 | 0 | 0 | 0 | 1 | 1 | 0 | 0 | 0 | 0 | 48 | ACT |
| ACT_ADD | 0 | 0 | 0 | 0 | 0 | 0 | 1 | 0 | 0 | 0 | 0 | 0 | | |

FIG. 12C

| CADD | | | | | | | | | | | | WL | Operation |
|---|---|---|---|---|---|---|---|---|---|---|---|---|---|
| 12 | 11 | 10 | 9 | 8 | 7 | 6 | 5 | 4 | 3 | 2 | 1 | | |
| 0 | 0 | 0 | 0 | 0 | 0 | 0 | 0 | 0 | 0 | 1 | 0 | 2 | SKIP |
| ... | | | | | | | | | | | | | SKIP |
| 0 | 0 | 0 | 0 | 0 | 0 | 0 | 0 | 1 | 1 | 1 | 1 | 15 | SKIP |
| 0 | 0 | 0 | 0 | 0 | 0 | 0 | 1 | 0 | 0 | 0 | 0 | 16 | SKIP |
| 0 | 0 | 0 | 0 | 0 | 0 | 0 | 1 | 0 | 0 | 0 | 1 | 17 | SKIP |
| ... | | | | | | | | | | | | | SKIP |
| 0 | 0 | 0 | 0 | 0 | 0 | 0 | 1 | 1 | 1 | 1 | 1 | 31 | SKIP |
| 0 | 0 | 0 | 0 | 0 | 0 | 1 | 0 | 0 | 0 | 0 | 0 | 32 | REF |
| 0 | 0 | 0 | 0 | 0 | 0 | 1 | 0 | 0 | 0 | 0 | 1 | 33 | REF |
| ... | | | | | | | | | | | | | REF |
| 0 | 0 | 0 | 0 | 0 | 0 | 1 | 1 | 0 | 0 | 0 | 0 | 48 | REF |
| ... | | | | | | | | | | | | | REF |
| 0 | 0 | 0 | 0 | 0 | 0 | 1 | 1 | 1 | 1 | 1 | 0 | 62 | REF |
| 0 | 0 | 0 | 0 | 0 | 0 | 1 | 1 | 1 | 1 | 1 | 1 | 63 | REF |
| 0 | 0 | 0 | 0 | 0 | 1 | 0 | 0 | 0 | 0 | 0 | 0 | 64 | SKIP |
| ... | | | | | | | | | | | | | SKIP |
| 0 | 0 | 0 | 0 | 1 | 0 | 0 | 0 | 0 | 0 | 0 | 0 | 128 | SKIP |
| ... | | | | | | | | | | | | | SKIP |
| 1 | 1 | 1 | 1 | 1 | 1 | 1 | 1 | 1 | 1 | 1 | 1 | 4095 | SKIP |

FIG. 14A

| | | | | CADD | | | | | | | | WL | Operation |
|---|---|---|---|---|---|---|---|---|---|---|---|---|---|
| 12 | 11 | 10 | 9 | 8 | 7 | 6 | 5 | 4 | 3 | 2 | 1 | | |
| 0 | 0 | 0 | 0 | 0 | 0 | 0 | 0 | 0 | 0 | 0 | 0 | 0 | SKIP |
| 0 | 0 | 0 | 0 | 0 | 0 | 0 | 0 | 0 | 0 | 0 | 1 | 1 | SKIP |
| 0 | 0 | 0 | 0 | 0 | 0 | 0 | 0 | 0 | 0 | 1 | 0 | 2 | SKIP |
| 0 | 0 | 0 | 0 | 0 | 0 | 0 | 0 | 0 | 0 | 1 | 1 | 3 | SKIP |

FIG. 14B

| | 12 | 11 | 10 | 9 | 8 | 7 | 6 | 5 | 4 | 3 | 2 | 1 | WL | Operation |
|---|---|---|---|---|---|---|---|---|---|---|---|---|---|---|
| IADD | 0 | 0 | 0 | 0 | 0 | 0 | 0 | 0 | 0 | 0 | 0 | 1 | 1 | ACT |
| ACT_ADD | 0 | 0 | 0 | 0 | 0 | 0 | 0 | 0 | 0 | 0 | 0 | 1 | | |

FIG. 14C

| CADD | | | | | | | | | | | | WL | Operation |
|---|---|---|---|---|---|---|---|---|---|---|---|---|---|
| 12 | 11 | 10 | 9 | 8 | 7 | 6 | 5 | 4 | 3 | 2 | 1 | | |
| 0 | 0 | 0 | 0 | 0 | 0 | 0 | 0 | 0 | 1 | 0 | 0 | 4 | SKIP |
| 0 | 0 | 0 | 0 | 0 | 0 | 0 | 0 | 0 | 1 | 0 | 1 | 5 | SKIP |

FIG. 14D

| | 12 | 11 | 10 | 9 | 8 | 7 | 6 | 5 | 4 | 3 | 2 | 1 | WL | Operation |
|---|---|---|---|---|---|---|---|---|---|---|---|---|---|---|
| IADD | 0 | 0 | 0 | 0 | 0 | 0 | 0 | 0 | 1 | 0 | 0 | 0 | 8 | ACT |
| ACT_ADD | 0 | 0 | 0 | 0 | 0 | 0 | 0 | 0 | 1 | 0 | 0 | 1 | | |

FIG. 14E

| 12 | 11 | 10 | 9 | 8 | 7 | 6 | 5 | 4 | 3 | 2 | 1 | WL | Operation |
|---|---|---|---|---|---|---|---|---|---|---|---|---|---|
| \multicolumn{12}{c|}{CADD} | | |
| 0 | 0 | 0 | 0 | 0 | 0 | 0 | 0 | 0 | 1 | 1 | 0 | 6 | SKIP |
| 0 | 0 | 0 | 0 | 0 | 0 | 0 | 0 | 0 | 1 | 1 | 1 | 7 | SKIP |
| 0 | 0 | 0 | 0 | 0 | 0 | 0 | 0 | 1 | 0 | 0 | 0 | 8 | REF |
| 0 | 0 | 0 | 0 | 0 | 0 | 0 | 0 | 1 | 0 | 0 | 1 | 9 | REF |
| \multicolumn{12}{c|}{...} | | REF |
| 0 | 0 | 0 | 0 | 0 | 0 | 0 | 0 | 1 | 1 | 1 | 0 | 14 | REF |
| 0 | 0 | 0 | 0 | 0 | 0 | 0 | 0 | 1 | 1 | 1 | 1 | 15 | REF |
| 0 | 0 | 0 | 0 | 0 | 0 | 0 | 1 | 0 | 0 | 0 | 0 | 16 | SKIP |

FIG. 14F

|  | 12 | 11 | 10 | 9 | 8 | 7 | 6 | 5 | 4 | 3 | 2 | 1 | WL | Operation |
|---|---|---|---|---|---|---|---|---|---|---|---|---|---|---|
| IADD | 0 | 0 | 0 | 0 | 0 | 0 | 0 | 1 | 0 | 0 | 1 | 0 | 18 | ACT |
| ACT_ADD | 0 | 0 | 0 | 0 | 0 | 0 | 0 | 1 | 1 | 0 | 0 | 1 |  |  |

FIG. 14G

| CADD | | | | | | | | | | | | WL | Operation |
|---|---|---|---|---|---|---|---|---|---|---|---|---|---|
| 12 | 11 | 10 | 9 | 8 | 7 | 6 | 5 | 4 | 3 | 2 | 1 | | |
| 0 | 0 | 0 | 0 | 0 | 0 | 0 | 1 | 0 | 0 | 0 | 1 | 17 | REF |
| 0 | 0 | 0 | 0 | 0 | 0 | 0 | 1 | 0 | 0 | 1 | 0 | 18 | REF |
| 0 | 0 | 0 | 0 | 0 | 0 | 0 | 1 | 0 | 0 | 1 | 1 | 19 | REF |
| ... | | | | | | | | | | | | | REF |
| 0 | 0 | 0 | 0 | 0 | 0 | 0 | 1 | 1 | 1 | 1 | 1 | 31 | REF |
| 0 | 0 | 0 | 0 | 0 | 0 | 1 | 0 | 0 | 0 | 0 | 0 | 32 | SKIP |
| ... | | | | | | | | | | | | | SKIP |
| 1 | 1 | 1 | 1 | 1 | 1 | 1 | 1 | 1 | 1 | 1 | 1 | 4095 | SKIP |

SEMICONDUCTOR MEMORY DEVICE INCLUDING REFRESH CONTROL CIRCUIT WITH DUAL REFRESH RATE AND MEMORY SYSTEM

CROSS-REFERENCE TO RELATED APPLICATION

The present application claims priority under 35 U.S.C. § 119 (a) to Korean Patent Application No. 10-2022-0030039, filed in the Korean Intellectual Property Office on Mar. 10, 2022, which is incorporated herein by reference in its entirety.

BACKGROUND

1. Field

Various embodiments described herein relate to a semiconductor memory device for performing a refresh operation.

2. Description of the Related Art

Semiconductor memory devices include a plurality of memory cells. Each memory cell may include a transistor serving as a switch and a capacitor storing a charge (i.e., data). The data may have one of two logic levels, namely a high logic level (e.g., Logic 1) and a low logic level (Logic 0). The logic level of the data may depend on whether or not charge is stored in the capacitor, that is, whether the terminal voltage of the capacitor is high or low.

Since data are stored in the form of charges accumulated in the capacitor, theoretically storing data should not consume power. However, due to current leakage caused by a PN coupling of the transistor, an initial amount of charge stored in the capacitor of each memory cell may not be stably maintained. As a result, data stored in the memory cell may be lost. In an attempt to prevent losing data, data in the memory cell may be read before the data is lost and the capacitor may be recharged to ensure that a sufficient amount of charge is stored. This operation may be performed repeatedly at predetermined periods to retain accuracy of the data. This process of recharging a memory cell may be referred to as a refresh operation.

The refresh operation is divided into an auto-refresh operation that is performed whenever a refresh command is applied from a memory controller to a memory device, and a self-refresh operation that is performed by the memory device itself when the memory controller sets only a refresh section. In the auto-refresh operation, the memory controller may provide a plurality of refresh commands for performing a refresh operation on some or all of a plurality of banks of the memory device, and the memory device may sequentially refresh word lines whenever the refresh command is inputted.

SUMMARY

Various embodiments are directed to a semiconductor memory device capable of selectively performing a refresh operation on a word line selected based on a most significant high bit of an input address inputted together with an active command.

In accordance with an embodiment, a semiconductor memory device includes: a refresh counter generating a counting address that is sequentially increasing according to a refresh command; an active latch generating an active address corresponding to an input address according to an active command; and a refresh control circuit repeatedly performing a first refresh period and a second refresh period according to the refresh command, and controlling selective refresh of one or more word lines corresponding to the counting address selected based on one or more high bits of the active address during the first refresh period and controlling sequential refresh of the word lines corresponding to the counting address during the second refresh period.

In accordance with an embodiment, a memory system includes: a memory controller transmitting a preset number of refresh commands and transmitting an address with an active command, during a first refresh period and a second refresh period; and a memory device generating a counting address sequentially increasing according to the refresh commands, generating an active address corresponding to the address according to the active command, selectively refreshing one or more word lines corresponding to the counting address selected based on one or more high bits of the active address during the first refresh period, and sequentially refreshing the word lines corresponding to the counting address during the second refresh period.

In accordance with an embodiment, an operating method of a memory system includes providing, at a memory controller, a preset number of refresh commands during a first refresh period; generating, at a memory device, a counting address sequentially increasing according to the refresh commands, and refreshing, during the first refresh period, one or more word lines corresponding to the counting address selected based on one or more high bits of an active address; providing, at the memory controller, a preset number of refresh commands during a second refresh period; and generating, at the memory device, the counting address sequentially increasing according to the refresh commands, and refreshing, during the second refresh period, all word lines corresponding to the counting address, wherein refreshing during the first refresh period and refreshing during the second refresh period are repeatedly performed.

These and other features and advantages of the embodiments disclosed herein will be better understood by those with ordinary skill in the field relating to the following detailed description in conjunction with the accompanying drawings.

BRIEF DESCRIPTION OF THE DRAWINGS

FIGS. 11 to 12C are a waveform diagram and tables for describing an operating method of a semiconductor memory device in accordance with an embodiment of the present disclosure.

FIGS. 13 to 14G are a waveform diagram and tables for describing an operating method of a semiconductor memory device in accordance with another embodiment of the present disclosure.

DETAILED DESCRIPTION

Figure 1:
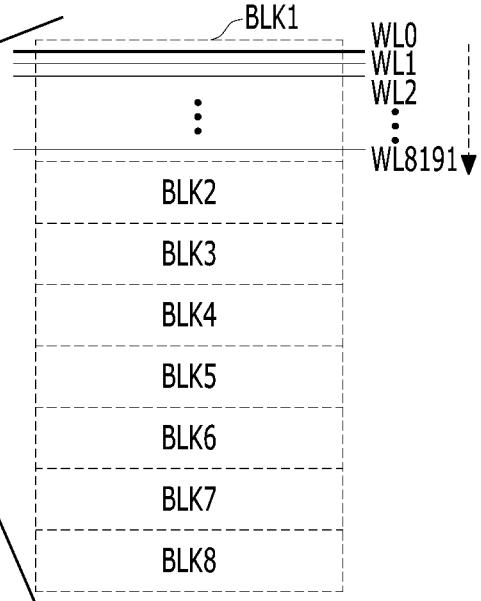
FIG. 1 is a diagram illustrating a refresh operation of a semiconductor memory device.

Various embodiments will be described below in more detail with reference to the accompanying drawings. The subject matter described, however, be embodied in different forms and should not be construed as limited to the embodiments set forth herein. Rather, these embodiments are provided so that this disclosure will be thorough and complete, and will fully convey the scope of the described subject matter to those skilled in the art. Throughout the disclosure, like reference numerals refer to like parts throughout the various figures and embodiments.

It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the described subject matter.

It will be further understood that the terms "comprises," "comprising," "has," "having," "includes," and "including" when used in this specification, specify the presence of the stated elements and do not preclude the presence or addition of one or more other elements. As used herein, the term "and/or" includes any and all combinations of one or more of the associated listed items.

As used herein, singular forms may include the plural forms as well and vice versa, unless the context clearly indicates otherwise. The articles 'a' and 'an' as used in this application and the appended claims should be construed to mean 'one or more' unless specified otherwise or clear from context to be directed to a singular form.

Hereinafter, in order to faithfully explain the gist of the present invention, a row control aspect related to a refresh operation will be mainly described.

FIG. 1 is a diagram illustrating a refresh operation of a semiconductor memory device 10.

Referring to FIG. 1, the semiconductor memory device 10 may include a plurality of banks BK, e.g., 16 banks. A plurality of row lines (i.e., word lines) of the banks BK may be designated by a logic combination of bits of a row address, respectively. Each bank BK may be divided into a plurality of blocks (for example, first to eighth blocks BLK1 to BLK8) according to a refresh unit.

A memory controller periodically issues a refresh command to the memory device 10 at every refresh interval (i.e., tREFI) set in the specification. For example, in the case of DDR4 SDRAM, the memory controller must issue 8K (i.e., 8192) refresh commands per refresh interval tREFI for a period of 64 ms per refresh cycle (i.e., tREF), and the memory device 10 may perform a refresh operation of sequentially refreshing the word lines in response to the 8K refresh commands. The refresh operation may be performed in units of word lines, and the refresh operation is performed by activating-precharging each word line for a row address strobe minimum time (i.e., tRASmin).

Since the memory device 10 needs to refresh all word lines in response to the 8K refresh commands input during a refresh cycle tREF, the memory device 10 may simultaneously activate a plurality of word lines per refresh command. For example, when each bank BK includes 64K word lines, each of the first to eighth blocks BLK1 to BLK8 includes 8K word lines (i.e., the first to 8192nd word lines WL0 to WL8191), and the word lines of each block may be refreshed simultaneously in response to a refresh command. Accordingly, the memory device 10 may simultaneously refresh eight word lines (i.e., 8*16=128) in the 16 banks BK in response to one refresh command.

As a result, the memory device 10 may consume power for refresh operations for ensuring a data retention time in addition to consuming power for active operations, read operations, write operations, and precharge operations, for example.

Hereinafter, a method will be described to minimize the current power consumption during a refresh operation by skipping a refresh operation of a word line on which an active operation is not performed.

Figure 2:
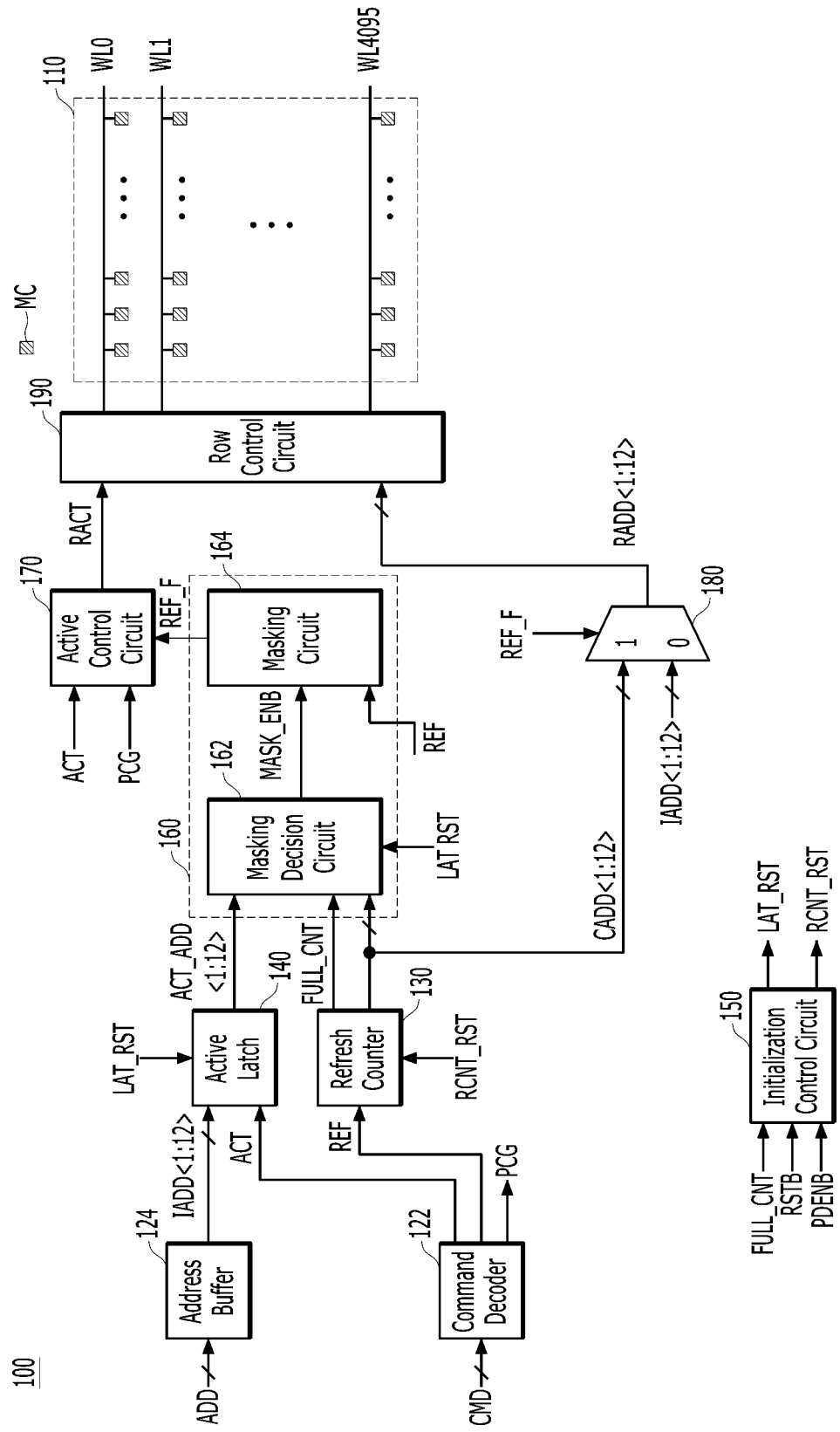
FIG. 2 is a block diagram illustrating a semiconductor memory device in accordance with an embodiment of the present disclosure.

FIG. 2 is a block diagram illustrating a semiconductor memory device 100 in accordance with an embodiment of the present disclosure. Referring to FIG. 2, the semiconductor memory device 100 may include a memory cell array 110, a command decoder 122, an address buffer 124, a refresh counter 130, an active latch 140, an initialization control circuit 150, a refresh control circuit 160, an active control circuit 170, an address selection circuit 180, and a row control circuit 190.

The memory cell array 110 may include a plurality of memory cells MC disposed in the form of an array between a plurality of word lines WL and a plurality of bit lines. As described in FIG. 1, the memory cell array 110 may include a plurality of banks each consisting of a plurality of blocks that are divided according to a refresh unit. In FIG. 2, a memory cell array 110 is illustrated in which first to 4096th word lines WL0 to WL4095 are disposed.

The command decoder 122 may decode a command CMD provided from an external device (e.g., a memory controller), and generate various internal commands related to a row access operation, such as an active command ACT, a precharge command PCG, a refresh command REF. Further, the command decoder 122 may generate various internal commands related to a data input/output operation, such as a read command, a write command, and the like.

The address buffer 124 may buffer an address ADD provided from the memory controller, and generate an input address IADD<1:12>. The input address IADD<1:12> may be configured by a row address for designating the word lines WL and a column address for designating the bit lines. In an embodiment, the input address IADD<1:12> may be configured to have 12 bits for designating the first to 4096th word lines WL0 to WL4095. Each of the command CMD and the address ADD may include multi-bits.

The refresh counter 130 may generate a counting address CADD<1:12> that is sequentially increasing according to the refresh command REF. The refresh counter 130 may increase a value of the counting address CADD<1:12> by "+1" whenever the refresh command REF is inputted. The refresh counter 130 may initialize all bits of the counting address CADD<1:12> to a low bit, in response to a first initialization signal RCNT_RST. In an embodiment, the counting address CADD<1:12> is configured to have the same 12 bits as the input address IADD<1:12>. In the following examples, the input address IADD<1:12> may be configured to have 12 bits for designating the first to 4096th word lines WL0 to WL4095 and the counting address CADD<1:12> is configured to have the same 12 bits as the input address IADD<1:12>. The refresh counter 130 may output a full-count signal FULL_CNT by activating the full-counting signal FULL_CNT to a logic high level after all bits of the counting address CADD<1:12> become high bits. That is, when the refresh command REF is inputted 4096 times, the refresh counter 130 may activate and output the full-counting signal FULL_CNT to a logic high level. The first initialization signal RCNT_RST may be activated according to the full-counting signal FULL_CNT. A detailed configuration of the refresh counter 130 will be described with reference to FIG. 3.

The active latch 140 may generate an active address ACT_ADD<1:12> corresponding to the input address IADD<1:12> according to the active command ACT. In particular, whenever the active command ACT is inputted, the active latch 140 may generate the active address ACT_ADD<1:12> consisting of bits respectively corresponding to the bits of the input address IADD<1:12>, and may store only a most significant high bit from among the bits of the input address IADD<1:12> as a corresponding bit of the active address ACT_ADD<1:12>. The input address IADD<1:12> that is inputted together with the active command ACT may be an address for designating a word line to be activated according to the active command ACT during an active operation. In an embodiment, the most significant high bit may be defined as a high bit positioned at the top (leftmost position) of a plurality of high bits constituting a specific address. The active latch 140 may be initialized in response to a second initialization signal LAT_RST to initialize the active address ACT_ADD<1:12>. A detailed configuration of the active latch 140 will be described with reference to FIG. 4.

The initialization control circuit 150 may generate the first initialization signal RCNT_RST and the second initialization signal LAT_RST according to the full-counting signal FULL_CNT, a power-down signal PDENB and a reset mode signal RSTB. The initialization control circuit 150 may activate the first initialization signal RCNT_RST in response to the full-counting signal FULL_CNT, and activate the second initialization signal LAT_RST in response to the first initialization signal RCNT_RST, the power-down signal PDENB, or the reset mode signal RSTB. The power-down signal PDENB may be activated to a logic low level in a power-down mode, and the reset mode signal RSTB may be activated to a logic low level during a reset mode for initializing the memory device 100. A detailed configuration of the initialization control circuit 150 will be described with reference to FIG. 5.

The refresh control circuit 160 may repeatedly perform a first refresh period and a second refresh period according to the refresh command REF. Each of the first refresh period and the second refresh period may be performed during a refresh cycle tREF. For example, in an auto-refresh operation, the memory controller may provide the refresh command REF 4096 times during each refresh cycle tREF. The refresh control circuit 160 may control one or more word lines to be selectively refreshed in response to the refresh command REF provided 4096 times during the first refresh period. The word lines correspond to the counting address CADD<1:12> selected based on one or more high bits of the active address ACT_ADD<1:12>. During the first refresh period, when the high bit of the active address ACT_ADD<1:12> is a Kth bit, the refresh control circuit 160 may control the refresh of only one or more word lines corresponding to the counting address CADD<1:12>, for which the most significant high bit is the Kth bit, and skip the refreshing of the other word lines. In addition, the refresh control circuit 160 may control all word lines corresponding to the counting address CADD<1:12> to be sequentially refreshed according to the refresh command REF provided 4096 times during the second refresh period.

In detail, the refresh control circuit 160 may include a masking decision circuit 162 and a masking circuit 164.

The masking decision circuit 162 may generate a section control signal (SKIP_CTRL of FIG. 6) for dividing the first refresh period and the second refresh period according to the refresh command REF. Preferably, the masking decision circuit 162 may generate the section control signal SKIP_CTRL to designate the first refresh period or the second refresh period according to the full-counting signal FULL_CNT that is activated whenever the refresh command REF reaches a predetermined number of times (e.g., 4096 times). According to the section control signal SKIP_CTRL, the masking decision circuit 162 may generate a masking signal MASK_ENB by comparing the active address ACT_ADD<1:12> with the counting address CADD<1:12>. The masking signal MASK_ENB may be activated to a logic low level. The masking decision circuit 162 may be initialized according to the second initialization signal LAT_RST. A detailed configuration of the masking decision circuit 162 will be described with reference to FIGS. 6 to 8.

The masking circuit 164 may output a final refresh command REF_F by selectively masking the refresh command REF according to the masking signal MASK_ENB. When the masking signal MASK_ENB is activated to a logic low level, the masking circuit 164 may mask the refresh command REF so that the final refresh command REF_F is not outputted. A detailed configuration of the masking circuit 164 will be described with reference to FIG. 9.

The active control circuit 170 may generate a row active signal RACT according to the active command ACT, the precharge command PCG, and the final refresh command REF_F. The active control circuit 170 may generate the row active signal RACT that is activated according to the active command ACT and deactivated according to the precharge command PCG. The active control circuit 170 may generate the row active signal RACT that is activated according to the final refresh command REF_F and deactivated after a row address strobe minimum time tRASmin.

The address selection circuit 180 may output a row address RADD<1:12> by selecting one of the counting address CADD<1:12> and the input address IADD<1:12> according to the final refresh command REF_F. The address selection circuit 180 may output the input address IADD<1:12> as the row address RADD<1:12>, and output the counting address CADD<1:12> as the row address RADD<1:12> when the final refresh command REF_F is inputted.

The row control circuit 190 may activate one or more word lines (e.g., one of the first to 4096th word lines WL0 to WL4095) corresponding to the row address RADD<1:12> according to the row active signal RACT.

Figure 3:
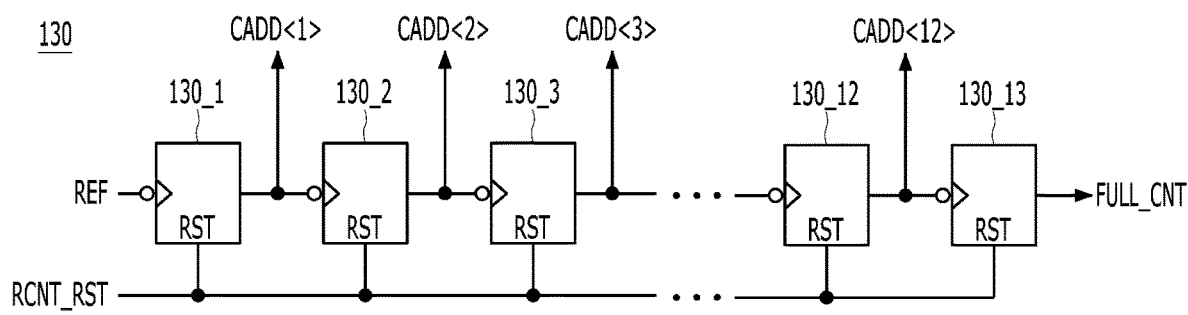
FIG. 3 is a circuit diagram illustrating a refresh counter of FIG. 2.

FIG. 3 is a circuit diagram illustrating a refresh counter 130 of FIG. 2.

Referring to FIG. 3, the refresh counter 130 may include a first to 13th unit counters 130_1 to 130_13 coupled in series. The first to 13th unit counters 130_1 to 130_13 may receive the refresh command REF and transmit an input signal to an output terminal in synchronization with a falling edge of the refresh command REF. The first to 13th unit counters 130_1 to 130_13 may be initialized in response to the first initialization signal RCNT_RST inputted through a reset terminal RST. Outputs of the first to 12th unit counters 130_1 to 130_12 may form the counting address CADD<1:12>, and an output of the last 13th unit counter 130_13 may be used as the full-counting signal FULL_CNT.

In the above configuration, the refresh counter 130 may generate the counting address CADD<1:12> that is sequentially increasing from "0000 0000 0000" to "1111 1111 1111" by counting the number of inputs of the refresh command REF. When the refresh command REF is input 4096 times, the refresh counter 130 may activate and output the full-counting signal FULL_CNT to a logic high level, and may initialize the counting address CADD<1:12> to "0000 0000 0000".

Figure 4:
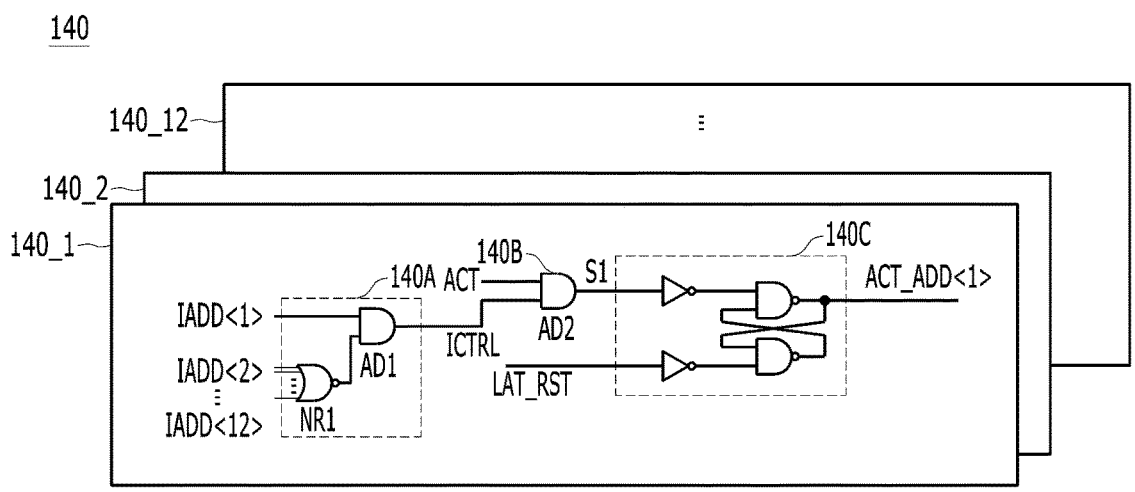
FIG. 4 is a circuit diagram illustrating an active latch of FIG. 2.

FIG. 4 is a circuit diagram illustrating an active latch 140 of FIG. 2.

Referring to FIG. 4, the active latch 140 may include first to 12th unit latches 140_1 to 140_12, each corresponding to each bit of the input address IADD<1:12> and storing each bit of the active address ACT_ADD<1:12>. Each of the first to 12th unit latches 140_1 to 140_12 may have substantially the same configuration.

For example, the first unit latch 140_1 may include an input control unit 140A, an input unit 140B, and a first SR latch 140C.

The input control unit 140A may generate an input control signal ICTRL that is activated when a corresponding bit (i.e., a first bit IADD<1> from among the input address IADD<1:12>) is the most significant high bit. The input control unit 140A may deactivate the input control signal ICTRL when any one of the remaining bits (i.e., second to 12th bits IADD<2> to IADD<12>) positioned higher than the first bit IADD<1> is a high bit, and may activate the input control signal ICTRL according to the first bit IADD<1> when all of the second to 12th bits IADD<2> to IADD<12> are low bits. For example, the input control unit 140A may activate the input control signal ICTRL to a logic high level when all of the second to 12th bits IADD<2> to IADD<12> are low bits and the first bit IADD<1> is a high bit. To output the input control signal ICTRL, the input control unit 140A may include a NOR gate NR1 for performing a logic NOR operation on the second to 12th bits IADD<2> to IADD<12>, and a first AND gate AD1 for performing a logic AND operation on an output of the NOR gate NR1 and the first bit IADD<1>

The input unit 140B may receive the input control signal ICTRL as a first set signal S1 according to the active command ACT. The input unit 140B may receive the input control signal ICTRL as the first set signal S1 when the active command ACT is inputted. For example, the input unit 140B may include a second AND gate AD2 for performing a logic AND operation on the active command ACT and the input control signal ICTRL.

The first SR latch 140C may store a corresponding bit (i.e., a first bit ACT_ADD<1>) of the active address ACT_ADD<1:12>, which is set according to the first set signal S1 and reset according to the second initialization signal LAT_RST. For example, the first SR latch 140C may store the first bit ACT_ADD<1> as a high bit when the first set signal S1 is activated to a logic high level, and may store the first bit ACT_ADD<1> as a low bit when the second initialization signal LAT_RST is activated to a logic high level. The first SR latch 140C may be implemented as a known SR latch.

In the above configuration, the active latch 140 may store, as a corresponding bit of the active address ACT_ADD<1:12>, only most significant high bit from among the bits of the input address IADD<1:12>.

Figure 5:
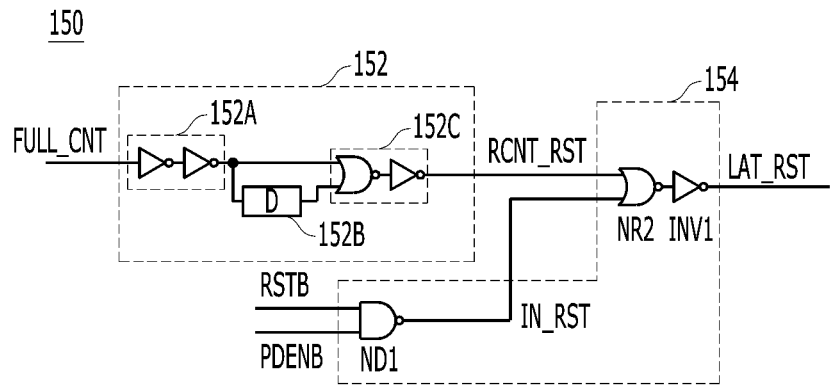
FIG. 5 is a circuit diagram illustrating an initialization control circuit of FIG. 2.

FIG. 5 is a circuit diagram illustrating an initialization control circuit 150 of FIG. 2.

Referring to FIG. 5, the initialization control circuit 150 may include a first initialization part 152 and a second initialization part 154.

The first initialization part 152 may generate the first initialization signal RCNT_RST when the full-counting signal FULL_CNT is activated. In more detail, the first initialization part 152 may include a buffer 152A, a delay 152B, and a logic combiner 152C. The buffer 152A may buffer the full-counting signal FULL_CNT. Preferably, the buffer 152A may be composed of even numbers of inverters. The delay 152B may delay the buffered full-counting signal outputted from the buffer 152A for a predetermined time. The logic combiner 152C may perform a logic OR operation on the buffered full-counting signal and the delayed full-counting signal outputted from the delay 152B. Preferably, the logic combiner 152C may be implemented with a NOR gate and an inverter. With the above configuration, the first initialization part 152 may generate the first initialization signal RCNT_RST maintaining an activation state for predetermined interval from a time point when the full-counting signal FULL_CNT is activated. Thus, the refresh counter 130 may be initialized after the full-counting signal FULL_CNT is activated.

The second initialization part 154 may activate the second initialization signal LAT_RST when any one of the first initialization signal RCNT_RST, the power-down signal PDENB or the reset mode signal RSTB is activated. In detail, the second initialization part 154 may include a NAND gate ND1, a NOR gate NR2, and an inverter INV1. When any one of the power-down signal PDENB and the reset mode signal RSTB is activated to a logic low level, the NAND gate ND1 may activate and output an intermediate initialization signal IN_RST to a logic high level. The NOR gate NR2 and the inverter INV1 may perform an OR operation on the intermediate initialization signal IN_RST and the first initialization signal RCNT_RST to output the second initialization signal LAT_RST. That is, the NOR gate NR2 and the inverter INV1 may activate the second initialization signal LAT_RST to a logic high level when any one of the intermediate initialization signal IN_RST and the first initialization signal RCNT_RST is activated to a logic high level. With the above configuration, when any one of the first initialization signal RCNT_RST, the power-down signal PDENB, and the reset mode signal RSTB is activated, the second initialization circuit 154 may activate the second initialization signal LAT_RST.

In an embodiment, since the second initialization signal LAT_RST is a signal activated in a power-down mode, in a reset mode, or after a full-counting signal FULL_CNT is activated, the active latch 140 may accumulate and store each bit of the input address IADD<1:12> as each bit of the active address ACT_ADD<1:12> whenever the active command ACT is input during the refresh cycle tREF.

Figure 6:
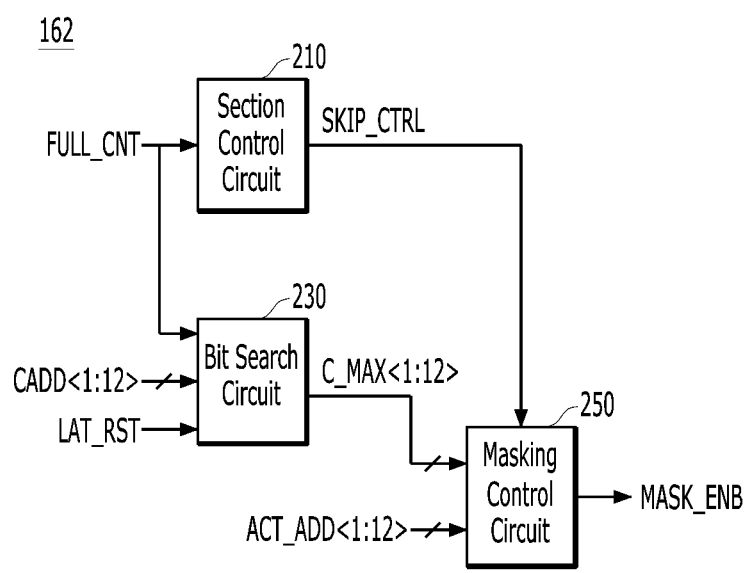
FIG. 6 is a detailed block diagram illustrating a masking decision circuit of FIG. 2.

FIG. 6 is a detailed block diagram illustrating a masking decision circuit 162 of FIG. 2.

Referring to FIG. 6, the masking decision circuit 162 may include a section control circuit 210, a bit search circuit 230, and a masking control circuit 250.

The section control circuit 210 may generate the section control signal SKIP_CTRL to designate the first refresh period or the second refresh period according to the full-counting signal FULL_CNT. For example, the section control circuit 210 may generate the section control signal SKIP_CTRL having a logic high level during the first refresh period, and may generate the section control signal SKIP_CTRL having a logic low level during the second refresh period. The refresh counter 130 may activate the full-counting signal FULL_CNT to a logic high level whenever the number of inputs of the refresh command REF reaches a predetermined number (i.e., 4096), and the section control circuit 210 may distinguish the first refresh section and the second refresh section by changing a logic level of the section control signal SKIP_CTRL according to the full-counting signal FULL_CNT. That is, the section control circuit 210 may generate the section control signal SKIP_CTRL of a logic low level by default, may generate the section control signal SKIP_CTRL of a logic high level when the number of inputs of the refresh command REF is input 4096 times, and then generate the section control signal SKIP_CTRL of a logic low level again when the refresh command REF is input another 4096 times. Accordingly, the first refresh period and the second refresh period may be repeatedly performed.

The bit search circuit 230 may generate first to 12th search bits C_MAX<1> to C_MAX<12> corresponding to the bits of the counting address CADD<1:12>, respectively, and may store a search bit corresponding to the most significant high bit, from among the bits of the counting address CADD<1:12>, as a high bit. For example, when the counting address CADD<1:12> of "0000 1010 0000" is input, the bit search circuit 230 may store the eighth search bit C_MAX<8>, as a high bit corresponding to the eighth bit CADD<8>, which is the most significant high bit. The bit search circuit 230 may be initialized according to the second initialization signal LAT_RST.

The masking control circuit 250 may generate the masking signal MASK_ENB by respectively comparing the first to 12th search bits C_MAX<1> to C_MAX<12> with the bits of the active address ACT_ADD<1:12> according to the section control signal SKIP_CTRL. When the section control signal SKIP_CTRL is at a logic low level, the masking control circuit 250 may alternatively deactivate and output the masking signal MASK_ENB according to a comparison result of the first to 12th search bits C_MAX<1> to C_MAX<12> and the active address ACT_ADD<1:12>. On the other hand, when the section control signal SKIP_CTRL is at a logic high level, the masking control circuit 250 may always deactivate and output the masking signal MASK_ENB to a logic high level regardless of the comparison result.

With the above configuration, during the first refresh period in which the section control signal SKIP_CTRL is at a logic low level, the masking decision circuit 162 may deactivate the masking signal MASK_ENB to a logic high level only when the most significant high bit of the counting address CADD<1:12> matches one or more high bits of the active address ACT_ADD<1:12>, and in other cases, activate the masking signal MASK_ENB to a logic low level. During the second refresh period in which the section control signal SKIP_CTRL is at a logic high level, the masking decision circuit 162 may deactivate the masking signal MASK_ENB to a logic high level regardless of the high bits of the active address ACT_ADD<1:12>.

Figure 7:
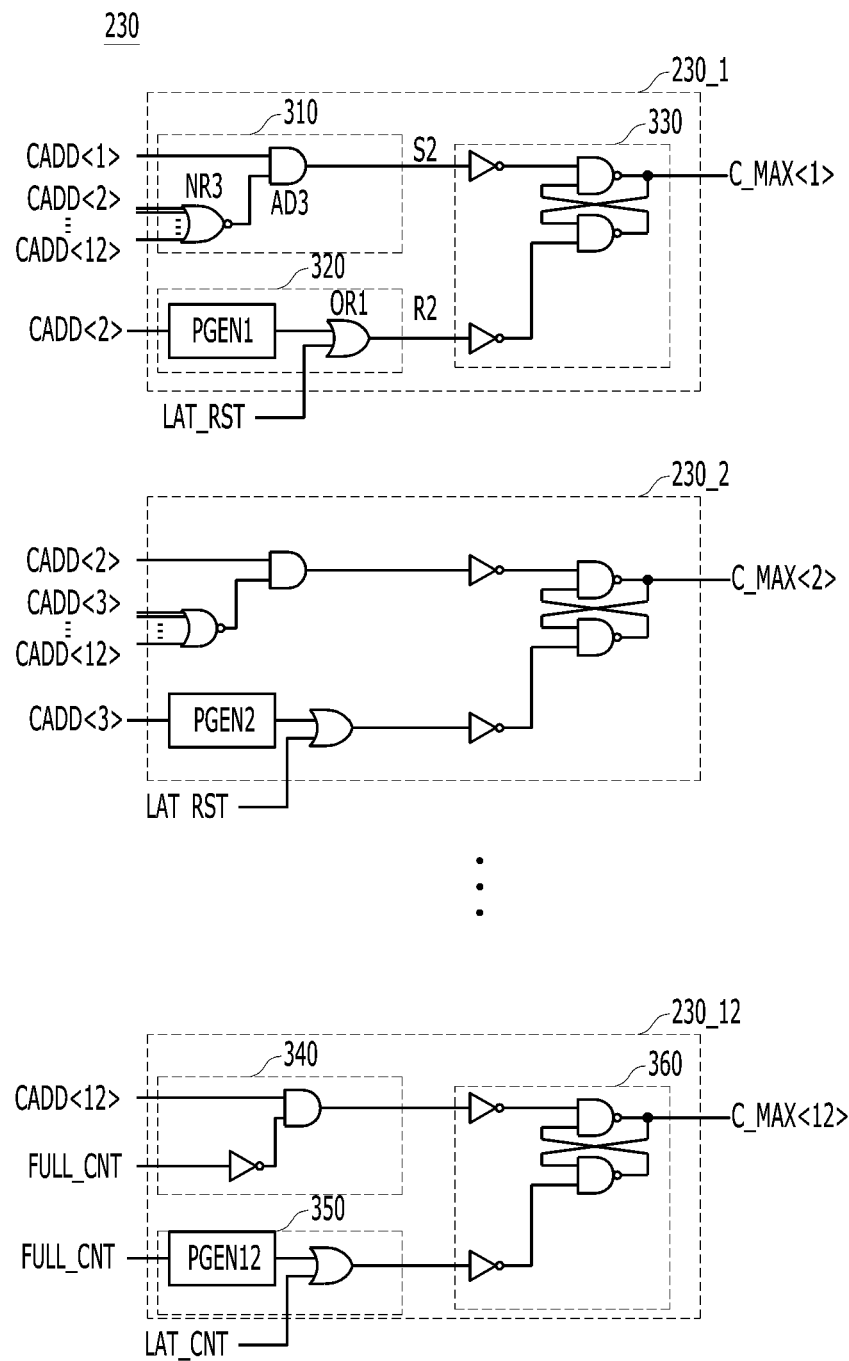
FIG. 7 is a circuit diagram illustrating a bit search circuit of FIG. 6.

FIG. 7 is a circuit diagram illustrating a bit search circuit 230 of FIG. 6.

Referring to FIG. 7, the bit search circuit 230 may include first to 12th bit detectors 230_1 to 230_12 respectively corresponding to the bits of the counting address CADD<1:12>. Each of the first to 11th bit detectors 230_1 to 230_11 may have substantially the same configuration.

For example, the first bit detector 230_1 may include a set signal generator 310, a reset signal generator 320, and a second SR latch 330.

The set signal generator 310 may generate a second set signal S2 that is activated when a corresponding bit (i.e., a first bit CADD<1> from among the counting address CADD<1:12>) is the most significant high bit. The set signal generator 310 may deactivate the second set signal S2 when any one of the remaining bits (i.e., second to 12th bits CADD<2> to CADD<12>) is positioned higher than the first bit CADD<1>, and may activate the second set signal S2 according to the first bit CADD<1> when all of the second to 12th bits CADD<2> to CADD<12> are low bits. The set signal generator 310 may activate the second set signal S2 to a logic high level when all of the second to 12th bits CADD<2> to CADD<12> are low bits, and the first bit CADD<1> is a high bit. For example, the set signal generator 310 may include a NOR gate NR3 for performing a logic NOR operation on the second to 12th bits CADD<2> to CADD<12>, and an AND gate AD3 for performing a logic AND operation on an output of the NOR gate NR3 and the first bit CADD<1>.

The reset signal generator 320 may generate a reset signal R2 according to the next upper bit from the first bit CADD<1> (i.e., the second bit CADD<2>) and the second initialization signal LAT_RST. When the second bit CADD<2> is a high bit or the second initialization signal LAT_RST is activated, the reset signal generator 320 may activate the reset signal R2 to a logic high level. For example, the reset signal generator 320 may include a pulse generator PGEN1 and an OR gate OR1. The pulse generator PGEN1 may generate a pulse signal that is activated in a predetermined interval when the second bit CADD<2> becomes a high bit. The OR gate OR1 may generate the reset signal R2 that is activated to a logic high level when any one of the pulse signal and the second initialization signal LAT_RST is activated. According to an embodiment, the pulse generator PGEN1 may be omitted.

The second SR latch 330 may store the first search bit C_MAX<1> that is set according to the second set signal S2 and reset according to the reset signal R2. For example, the second SR latch 330 may store the first search bit C_MAX<1> as a high bit when the second set signal S2 is activated to a logic high level, and may store the first search bit C_MAX<1> as a low bit when the reset signal R2 is activated to a logic high level. The second SR latch 330 may be implemented as a known SR latch.

Meanwhile, the 12th bit detectors 230_12 may include a configuration similar to the first bit detector 230_1. That is, the 12th bit detectors 230_12 may include a set signal generator 340, a reset signal generator 350, and a second SR latch 360. However, the set signal generator 340 of the 12th bit detectors 230_12 may include an inverter and an AND gate to generate a second set signal that is activated when the 12th bit CADD<12> is the most significant high bit. The set signal generator 340 may deactivate the second set signal when the full-counting signal FULL_CNT is activated to a logic high level, and may activate the second set signal S2 according to the 12th bit CADD<12> when the full-counting signal FULL_CNT is deactivated to a logic low level.

Figure 8:
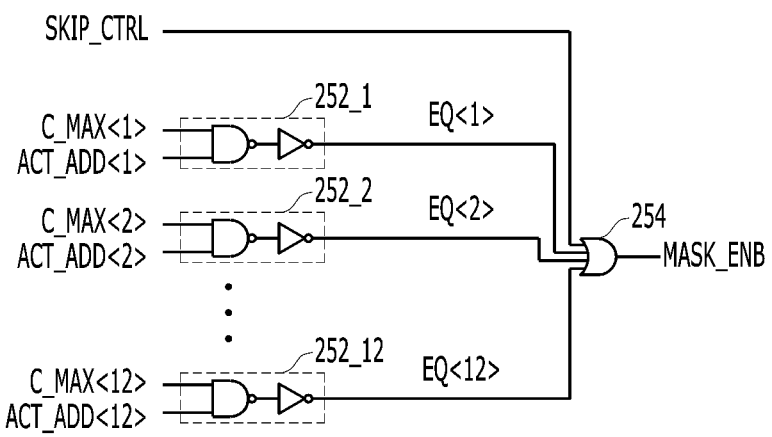
FIG. 8 is a circuit diagram illustrating a masking control circuit of FIG. 6.

With the above configuration, the bit search circuit 230 may generate and store a search bit corresponding to the most significant high bit of the counting address CADD<1:12>, as a high bit. FIG. 8 is a circuit diagram illustrating a masking control circuit 250 of FIG. 6.

Referring to FIG. 8, the masking control circuit 250 may include first to 12th comparators 252_1 to 252_12 and a signal output unit 254.

The first to 12th comparators 252_1 to 252_12 may output first to 12th comparison bits EQ<1> to EQ<12> by comparing the first to 12th search bits C_MAX<1> to C_MAX<12> with the bits of the active address ACT_ADD<1:12>, respectively. Each of the first to 12th comparators 252_1 to 252_12 may output a corresponding comparison bit as a high bit when both the corresponding search bit and the corresponding bit of the active address ACT_ADD<1:12> are high bits. For example, each of the first to 12th comparators 252_1 to 252_12 may be implemented with logic gates for performing a logic AND operation on the corresponding search bit and the corresponding bit of the active address ACT_ADD<1:12>.

When the section control signal SKIP_CTRL becomes a logic low level, the signal output unit 254 may selectively deactivate the masking signal MASK_ENB to a logic high level according to the first to 12th comparison bits EQ<1> to EQ<12>. When the section control signal SKIP_CTRL becomes a logic high level, the signal output unit 254 may deactivate the masking signal MASK_ENB to a logic high level regardless of the first to 12th comparison bits EQ<1> to EQ<12>. The signal output unit 254 may activate the masking signal MASK_ENB to a logic low level only when all of the first to 12th comparison bits EQ<1> to EQ<12> are low bits in a state in which the section control signal SKIP_CTRL becomes a logic low level. For example, the signal output unit 254 may be implemented with logic gates for performing a logic OR operation on the section control signal SKIP_CTRL and the first to 12th comparison bits EQ<1> to EQ<12>.

Figure 9:
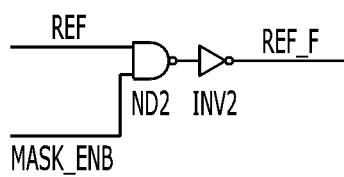
FIG. 9 is a circuit diagram illustrating a masking circuit of FIG. 2.

With the above configuration, the masking control circuit 250 may alternatively deactivate the masking signal MASK_ENB to a logic high level, according to a comparison result of the first to 12th search bits C_MAX<1> to C_MAX<12> and the bits of the active address ACT_ADD<1:12>, during the first refresh period. On the other hand, the masking control circuit 250 may always deactivate the masking signal MASK_ENB to a logic high level regardless of the high bit of the active address ACT_ADD<1:12> during the second refresh period. FIG. 9 is a circuit diagram illustrating a masking circuit 164 of FIG. 2.

Referring to FIG. 9, the masking circuit 164 may include a NAND gate ND2 and an inverter INV2 for performing a logic AND operation on the masking signal MASK_ENB and the refresh command REF. With the above configuration, when the masking signal MASK_ENB is activated to a logic low level, the masking circuit 164 may mask the refresh command REF so that the final refresh command REF_F is not outputted. On the other hand, when the masking signal MASK_ENB is deactivated to a logic high level, the masking circuit 164 may output the refresh command REF as the final refresh command REF_F.

Hereinafter, referring to FIGS. 2 to 10, an operation of a semiconductor memory device 100 will be described.

Figure 10:
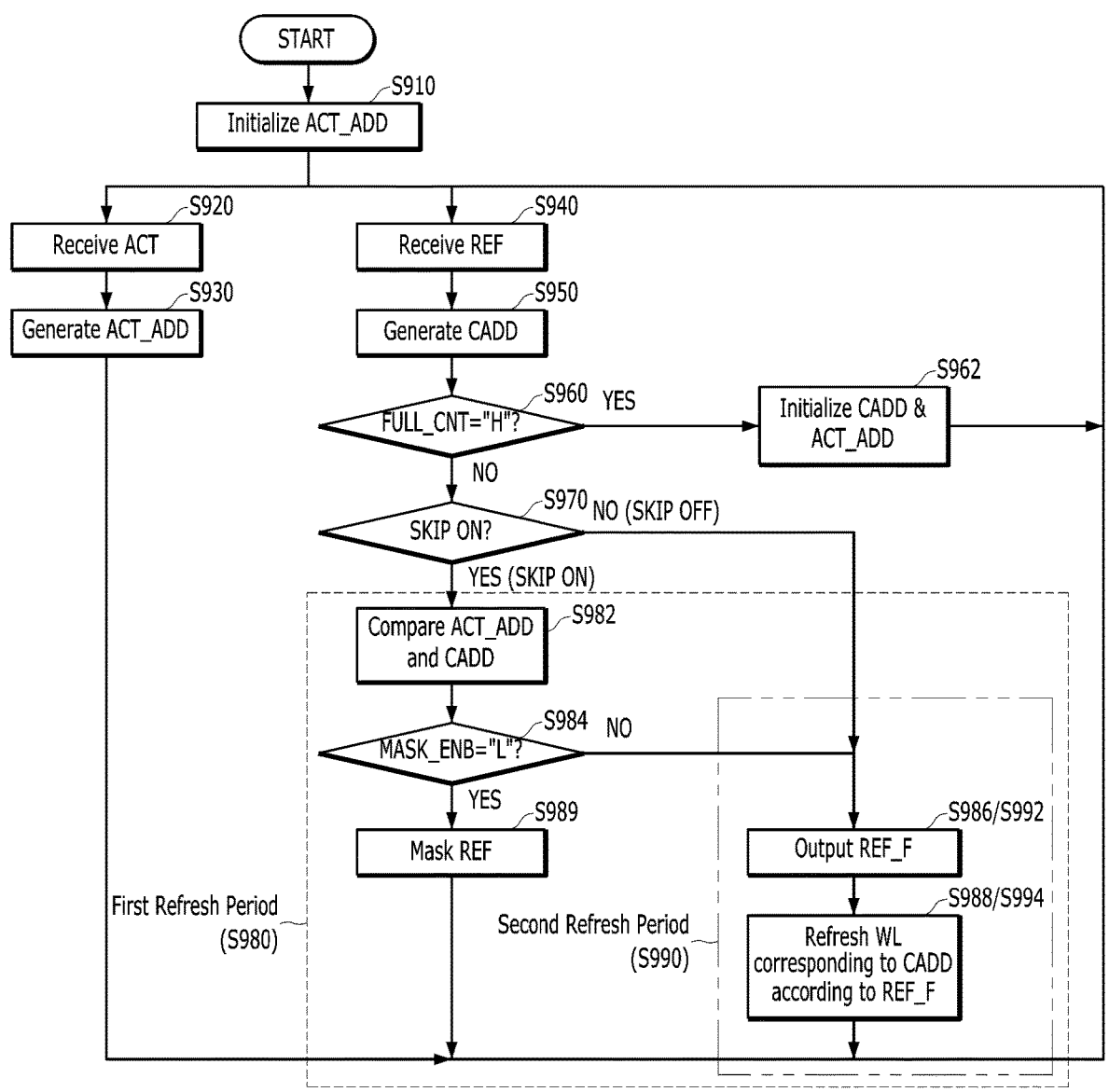
FIG. 10 is a flow chart for describing an operating method of a semiconductor memory device in accordance with an embodiment of the present disclosure.

FIG. 10 is a flow chart for describing an operating method of a semiconductor memory device 100 in accordance with an embodiment of the present disclosure.

Referring to FIG. 10, starting in a power-down mode or a reset mode, an initialization control circuit 150 may activate a second initialization signal LAT_RST according to the power-down signal PDENB or the reset mode signal RSTB. Accordingly, the active latch 140 may initialize the active address ACT_ADD<1:12> (at S910).

Thereafter, the command decoder 122 may decode the command CMD to generate internal commands such as the active command ACT, the refresh command REF, and the precharge command PCG. The address buffer 124 may buffer the address ADD to generate the input address IADD<1:12>.

When the active command ACT is inputted (at S920), the active control circuit 170 may generate the row active signal RACT that is activated according to the active command ACT and deactivated according to the precharge command PCG, and the address selection circuit 180 may output the input address IADD<1:12> as the row address RADD<1:12>. The row control circuit 190 may perform an active operation by activating one or more word lines corresponding to the row address RADD<1:12> according to the row active signal RACT. The active latch 140 may generate the active address ACT_ADD<1:12> according to the active command ACT by storing only the most significant high bit of the input address IADD<1:12> as the corresponding bit of the active address ACT_ADD<1:12> (at 930).

When the refresh command REF is inputted (at S940), the refresh counter 130 may generate the counting address CADD<1:12> of "0000 0000 0000" (at S950). Since the full-counting signal FULL_CNT may be deactivated to a logic low level ("NO" of S960), the section control circuit 210 may generate the section control signal SKIP_CTRL of a logic low level. Accordingly, the first refresh section may be entered ("YES (SKIP ON)" of S970).

During the first refresh period (at S980), the masking control circuit 250 may generate the masking signal MASK_ENB by comparing the active address ACT_ADD<1:12> with the counting address CADD<1:12> (at S982). When the counting address CADD<1:12> has the most significant high bit corresponding to the high bit of the active address ACT_ADD<1:12>, the masking control circuit 250 may deactivate the masking signal MASK_ENB to a logic high level ("NO" of S984) and the masking circuit 164 may output the refresh command REF as the final refresh command REF_F (at S986). The active control circuit 170 may generate the row active signal RACT that is activated according to the final refresh command REF_F and deactivated after the row address strobe minimum time tRASmin, and the address selection circuit 180 may output the row address RADD<1:12> by selecting the counting address CADD<1:12>. The row control circuit 190 may perform a refresh operation of activating one or more word lines corresponding to the row address RADD<1:12> according to the row active signal RACT (at S988).

On the other hand, when the counting address CADD<1:12> does not have the most significant high bit corresponding to the high bit of the active address ACT_ADD<1:12>, the masking control circuit 250 may activate the masking signal MASK_ENB to a logic low level ("YES" of S984), and the masking circuit 164 may mask the refresh command REF so that the final refresh command REF_F is not outputted (at S989). Accordingly, the corresponding refresh operation (at S986 and S988) may be skipped.

Whenever the refresh command REF is inputted, the refresh counter 130 may sequentially increase the value of the counting address CADD<1:12> from "0000 0000 0001" to "1111111111", and the above operations S970 to S989 may be repeatedly performed. When all bits of the counting address CADD<1:12> become high bits, the refresh counter 130 may activate the full-counting signal FULL_CNT as being fully counted ("YES" of S960). Accordingly, the initialization control circuit 150 may activate both the first initialization signal RCNT_RST and the second initialization signal LAT_RST, the refresh counter 130 may initialize the counting address CADD<1:12> and the active latch 140 may initialize the active address ACT_ADD<1:12> (at S962).

The section control circuit 210 may generate the section control signal SKIP_CTRL of a logic high level according to the full-counting signal FULL_CNT. Accordingly, the second refresh section may be entered ("NO (SKIP OFF)" of S970). During the second refresh period (at S990), the masking control circuit 250 may deactivate the masking signal MASK_ENB to a logic high level regardless of the high bit of the active address ACT_ADD<1:12>, and the masking circuit 164 may output the refresh command REF as the final refresh command REF_F (at S992). The row control circuit 190 may perform a refresh operation of activating one or more word lines that correspond to the counting address CADD<1:12> according to the row active signal RACT, which corresponds in turn to the final refresh command REF_F (at S994). Whenever the refresh command REF is inputted, the refresh counter 130 may sequentially increase the value of the counting address CADD<1:12> from "0000 0000 0001" to "1111 1111 1111", and the above operations S992 to S994 may be repeatedly performed.

As described above, the memory device 100 may repeatedly perform the first refresh period and the second refresh period. As described above, only word lines corresponding to the counting address CADD<1:12> selected based on the most significant high bit of the active address ACT_ADD<1: 12> may be refreshed during the first refresh period, and all word lines may be sequentially refreshed during the second refresh period. Accordingly, only memory cells that may store data due to active operations may be refreshed in the first refresh period, while all memory cells may be refreshed in the second refresh period, to thereby ensure a data retention time and to minimize the current consumption by 50%.

Figure 11:
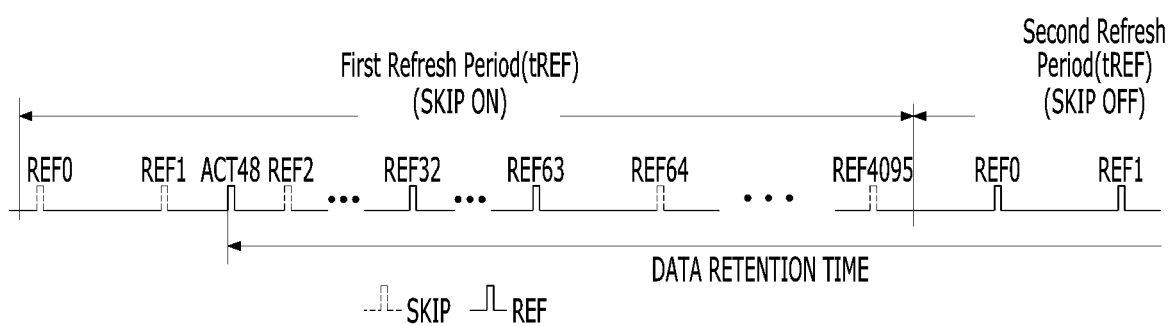

FIGS. 11 to 12C are a waveform diagram and tables for describing an operating method of a semiconductor memory device 100 in accordance with an embodiment of the present disclosure.

FIG. 11 is a waveform diagram showing a row active signal RACT for describing an active operation and a refresh operation, and FIGS. 12A to 12C are tables showing an operation during a first refresh period according to an active address ACT_ADD<1:12> and a counting address CADD<1:12>. FIGS. 11 to 12C illustrate an example in which one active command is input during the first refresh period.

Referring to FIGS. 11 and 12A, when the counting address CADD<1:12> for first and second word lines WL0 to WL1 is generated during the first refresh period, the masking signal MASK_ENB may be activated to a low level because the active address ACT_ADD<1:12> is not stored in the active latch 140. Accordingly, the refresh operations REF0 and REF1 for the first and second word lines WL0 to WL1 may be skipped.

Referring to FIGS. 11 and 12B, the input address IADD<1:12> of "0000 0011 0000" is input for an active operation ACT48 on a 49th word line WL48. After the active operation ACT48, the write operation may be performed, and accordingly, valid data may be written to memory cells connected to the activated 49th word line WL48. The active latch 140 may store only the most significant high bit (i.e., the sixth bit IADD<6> from among the bits of the input address IADD<1:12>) as the corresponding bit (i.e., the sixth bit ACT_ADD<6>) of the active address ACT_ADD<1:12>. Accordingly, the active address ACT_ADD<1:12> of "0000 0010 0000" may be stored in the active latch 140.

Referring to FIGS. 11 and 12C, since the most significant high bit of the counting address CADD<1:12> for third to 32nd word lines WL2 to WL31 is one of the second to fifth bits CADD<2> to CADD<5>, it does not correspond to the high bit (i.e., the sixth bit ACT_ADD<6>) of the active address ACT_ADD<1:12>. Accordingly, the masking signal MASK_ENB may be activated to a logic low level, and thus the refresh operations REF2 to REF31 for the third to 32nd word lines WL2 to WL31 may be skipped.

On the other hand, since, in the counting address CADD<1:12> for 33rd to 64th word lines WL32 to WL63, the most significant high bit of the counting address CADD<1:12> corresponds to the high bit ACT_ADD<6> of the active address ACT_ADD<1:12>, the masking signal MASK_ENB may be deactivated to a logic high level. Accordingly, the refresh operations REF32 to REF63 for the 33rd to 64th word lines WL32 to WL63 may be performed. That is, the refresh operation is performed on the 49th word line WL48 on which the active operation is performed during the first refresh period, so that data retention time of memory cells connected to the 49th word line WL48 may be secured.

Thereafter, since the most significant high bit of the counting address CADD<1:12> for 65th to 4096th word lines WL64 to WL4095 is one of the seventh to 12th bits CADD<7> to CADD<12>, it does not correspond to the high bit ACT_ADD<6> of the active address ACT_ADD<1: 12>. Accordingly, the masking signal MASK_ENB may be activated to a logic low level, and thus the refresh operations REF64 to REF4095 for the 65th to 4096th word lines WL64 to WL4095 may be skipped.

Referring back to FIG. 11, after the first refresh period is completed, a refresh operation may be sequentially performed on all word lines in the second refresh period.

Figure 13:
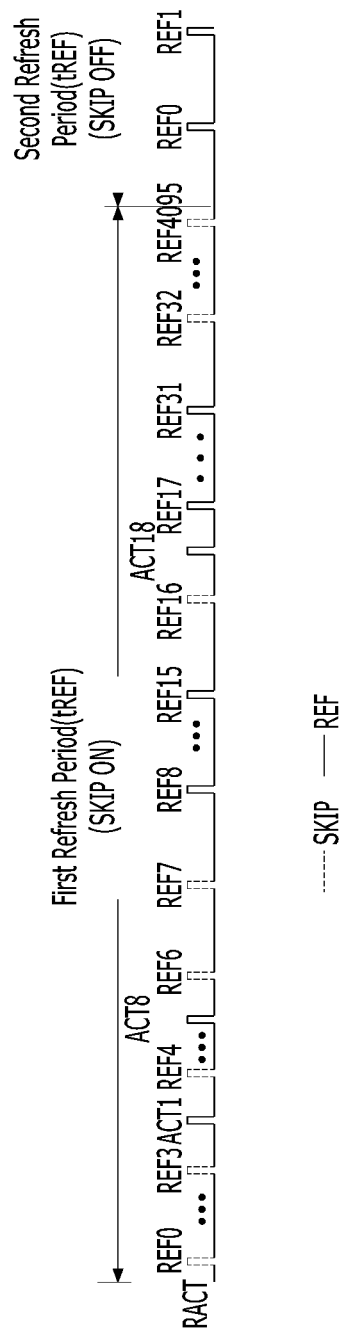

FIGS. 13 to 14G are a waveform diagram and tables for describing an operating method of a semiconductor memory device 100 in accordance with another embodiment of the present disclosure.

FIG. 13 is a waveform diagram showing a row active signal RACT for describing an active operation and a refresh operation, and FIGS. 14A to 14G are tables showing an operation during a first refresh period according to an active address ACT_ADD<1:12> and a counting address CADD<1:12>. FIGS. 13 to 14G illustrate an example in which the active command is input three times during the first refresh period.

Referring to FIGS. 13 and 14A, since the active address ACT_ADD<1:12> is not stored in the active latch 140, the refresh operations REF0 to REF3 for first to fourth word lines WL0 to WL3 may be skipped during the first refresh period.

Referring to FIGS. 13 and 14B, the input address IADD<1:12> of "0000 0000 0001" is input for an active operation ACT1 on a second word line WL1. After the active operation ACT1, the write operation may be performed, and accordingly, valid data may be written to memory cells connected to the activated second word line WL1. The active latch 140 may store only the most significant high bit (i.e., the first bit IADD<1> from among the bits of the input address IADD<1:12>) as the corresponding bit (i.e., the first bit ACT_ADD<1>) of the active address ACT_ADD<1:12>. Accordingly, the active address ACT_ADD<1:12> of "0000 0000 0001" may be stored in the active latch 140. At this time, since the active operation for the second word line WL1 has already been performed, there is no counting address CADD<1:12> having the most significant high bit corresponding to the high bit of the active address ACT_ADD<1:12> in the corresponding refresh period.

Referring to FIGS. 13 and 14C, since the most significant high bit of the counting address CADD<1:12> for fifth and sixth word lines WL4 and WL5 is the third bit CADD<3>, the masking signal MASK_ENB is activated to a logic low level, and thus the refresh operations REF4 to REF5 for the fifth and sixth word lines WL4 and WL5 may be skipped.

Referring to FIGS. 13 and 14D, the input address IADD<1:12> of "0000 0000 1000" is input for an active operation ACT8 on a ninth word line WL8. After the active operation ACT8, the write operation may be performed, and accordingly, valid data may be written to memory cells connected to the activated ninth word line WL8. The active latch 140 may store only the most significant high bit (i.e., the fourth bit IADD<4> from among the bits of the input address IADD<1:12>) as the corresponding bit (i.e., the fourth bit ACT_ADD<4>) of the active address ACT_ADD<1:12>. Accordingly, the active address ACT_ADD<1:12> of "0000 0000 1001" may be stored in the active latch 140.

Referring to FIGS. 13 and 14E, since the most significant high bit of the counting address CADD<1:12> for seventh and eighth word lines WL6 and WL7 is the third bit CADD<3>, the masking signal MASK_ENB is activated to a logic low level, and thus the refresh operations REF6 to REF7 for the seventh and eighth word lines WL6 and WL7 may be skipped.

On the other hand, since in the counting address CADD<1:12> for ninth to 16th word lines WL8 to WL15, the most significant high bit (i.e., the fourth bit CADD<4>) of the counting address CADD<1:12> corresponds to the high bit ACT_ADD<4> of the active address ACT_ADD<1:12>, the masking signal MASK_ENB may be deactivated to a logic high level. Accordingly, the refresh operations REF8 to REF15 for the ninth to 16th word lines WL8 to WL15 may be performed. That is, the refresh operation is performed on the ninth word line WL8, on which the active operation is performed during the first refresh period, so that data retention time of memory cells connected to the ninth word line WL8 may be secured.

Thereafter, since the most significant high bit of the counting address CADD<1:12> for a 17th word line WL16 is the fifth bit CADD<5>, the masking signal MASK_ENB may be activated to a logic low level, and thus the refresh operation REF16 for the 17th word line WL16 may be skipped.

Referring to FIGS. 13 and 14F, the input address IADD<1:12> of "0000 0001 0010" is input for an active operation ACT18 on a 19th word line WL18. After the active operation ACT18, the write operation may be performed, and accordingly, valid data may be written to memory cells connected to the activated 19th word line WL18. The active latch 140 may store only the most significant high bit (i.e., the fifth bit (IADD<5>) among the bits of the input address IADD<1:12>) as the corresponding bit (i.e., the fifth bit ACT_ADD<5>) of the active address ACT_ADD<1:12>. Accordingly, the active address ACT_ADD<1:12> of "0000 0001 1001" may be stored in the active latch 140.

Referring to FIGS. 13 and 14G, since in the counting address CADD<1:12> for ninth to 18th to 32nd word lines WL17 to WL31, the most significant high bit (i.e., the fifth bit CADD<5>) of the counting address CADD<1:12> corresponds to the high bit ACT_ADD<5> of the active address ACT_ADD<1:12>, the masking signal MASK_ENB may be deactivated to a logic high level. Accordingly, the refresh operations REF17 to REF31 for the 18th to 32nd word lines WL17 to WL31 may be performed. That is, the refresh operation is performed on the 19th word line WL18 on which the active operation is performed during the first refresh period, so that data retention time of memory cells connected to the 19th word line WL18 may be secured.

Thereafter, since the most significant high bit of the counting address CADD<1:12> for 33rd to 4096th word lines WL32 to WL4095 is one of the sixth to 12th bits CADD<6> to CADD<12>, the masking signal MASK_ENB may be activated to a logic low level, and thus the refresh operations REF32 to REF4095 for the 33rd to 4096th word lines WL32 to WL4095 may be skipped.

Referring back to FIG. 13, after the first refresh period is completed, a refresh operation may be sequentially performed on all word lines in the second refresh period.

As described above, in embodiments of the disclosure, a refresh operation of a word line on which an active operation is not performed is skipped in the first refresh period, and a refresh operation is performed on all word lines in the second period, thereby ensuring the data retention time and minimizing the current consumption.

Figure 15:
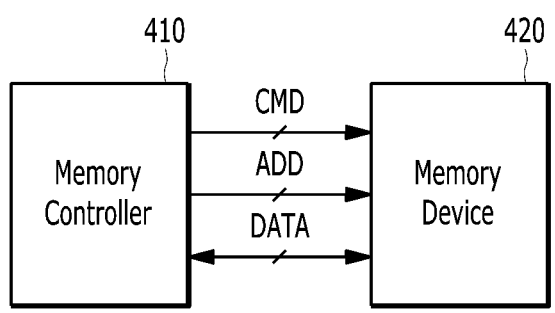
FIG. 15 is a block diagram illustrating a memory system in accordance with an embodiment of the present disclosure.

FIG. 15 is a block diagram illustrating a memory system 400 in accordance with an embodiment of the present disclosure.

Referring to FIG. 15, the memory system 400 may include a memory controller 410 and a memory device 420.

The memory controller 410 may control the operation of the memory device 420 by providing a command CMD and an address ADD to the memory device 420. The memory controller 410 may exchange data DATA with the memory device 420 during read and write operations. The memory controller 410 may provide an active command ACT, a precharge command PCG, or a refresh command REF to the memory device 420 by transmitting the command CMD. The memory controller 410 may transmit the address ADD for selecting one or more word lines or bit lines of the memory device 420 together with the active command ACT. The memory controller 410 may periodically transmit a preset number of refresh commands REF to the memory device 420. For example, the memory controller 410 may issue a refresh command 4096 times during a refresh cycle tREF.

The memory device 420 may have substantially the same configuration as the memory device 100 described in FIG. 2. The memory device 420 may include a refresh counter (130 of FIG. 2) that generates a counting address sequentially increasing according to the refresh command REF, an active latch (140 of FIG. 2) that generates an active address corresponding to the input address ADD according to the active command ACT, and a refresh control circuit (160 of FIG. 2) that repeatedly performs a first refresh period and a second refresh period according to the refresh command REF. In particular, the refresh control circuit 160 may control one or more word lines to be selectively refreshed during the first refresh period, the one or more word lines corresponding to the counting address selected based on the high bits of the active address, and may control all word lines corresponding to the counting address to be sequentially refreshed during the second refresh period. During the first refresh period, when the high bit of the active address is a Kth bit, the refresh control circuit 160 may control to refresh only one or more word lines corresponding to the counting address in which the most significant high bit is the Kth bit, and control to skip refreshing the other word lines.

According to embodiments of this disclosure, only memory cells that may write data in the first refresh period are refreshed, and all memory cells are refreshed in the second refresh period. That is, by skipping a refresh operation of a word line in which an active operation is not performed, the data retention time may be ensured and the current consumption may be minimized, thereby minimizing the power consumption consumed during the refresh operation.

While the present invention has been described with respect to the various embodiments, it will be apparent to those skilled in the art that various changes and modifications may be made without departing from the spirit and scope of the invention as defined in the following claims. For example, the logic gates and transistors illustrated in the above embodiments should be realized in different positions and types according to the polarity of an input signal.

What is claimed is:

1. A semiconductor memory device, comprising:
   a refresh counter generating a counting address that is sequentially increasing according to a refresh command;
   an active latch generating an active address corresponding to an input address according to an active command; and
   a refresh control circuit repeatedly performing a first refresh period and a second refresh period according to the refresh command, and controlling selective refresh of one or more word lines, among a plurality of word lines, according to the counting address selected based on one or more high bits of the active address during the first refresh period, and controlling sequential refresh of the plurality of word lines according to the counting address during the second refresh period.

2. The semiconductor memory device of claim 1, wherein the refresh control circuit refreshes the one or more word lines corresponding to the counting address in which the most significant high bit corresponds to the high bit of the active address, and skips refreshing remainder of the plurality of word lines, during the first refresh period.

3. The semiconductor memory device of claim 1, wherein the active latch generates the active address having bits respectively corresponding to bits of the input address, and stores only a most significant high bit of the bits of the input address as a corresponding bit of the active address when the active command is inputted.

4. The semiconductor memory device of claim 1,
   wherein the active latch includes a plurality of unit latches corresponding to bits of the input address and stores bits of the active address, respectively, and
   wherein each of the unit latches includes:
   an input control unit generating an input control signal that is activated when a corresponding bit of the input address is a most significant high bit;
   an input unit receiving the input control signal as a first set signal according to the active command; and
   a first SR latch storing a corresponding bit of the active address, which is set according to the first set signal and reset according to a full-counting signal of the refresh counter, a power-down signal or a reset mode signal.

5. The semiconductor memory device of claim 4, wherein the input control unit includes:

a first logic gate performing a logic NOR operation on remaining bits positioned higher than the corresponding bit of the input address; and
a second logic gate performing a logic AND operation on an output of the first logic gate and the corresponding bit of the input address to output the input control signal.

6. The semiconductor memory device of claim 1, further comprising:
   a first initialization part generating a first initialization signal for initializing the refresh counter, according to a full-counting signal of the refresh counter; and
   a second initialization part generating a second initialization signal for initializing the active latch when any one of the first initialization signal, a power-down signal or a reset mode signal is activated.

7. The semiconductor memory device of claim 1, wherein the refresh control circuit includes:
   a masking decision circuit generating a section control signal for dividing the first refresh period and the second refresh period according to the refresh command, and generating a masking signal by comparing the active address with the counting address according to the section control signal; and
   a masking circuit outputting a final refresh command by selectively masking the refresh command according to the masking signal.

8. The semiconductor memory device of claim 7, wherein the masking decision circuit includes:
   a section control circuit generating the section control signal while changing a logic level of the section control signal when the number of inputs of the refresh command reaches a predetermined number;
   a bit search circuit generating a plurality of search bits corresponding to bits of the counting address, respectively, and storing a search bit corresponding to a most significant high bit of the bits of the counting address, as a high bit; and
   a masking control circuit generating the masking signal by respectively comparing the search bits with bits of the active address according to the section control signal.

9. The semiconductor memory device of claim 8,
   wherein the bit search circuit includes a plurality of bit detectors corresponding to the bits of the counting address, respectively, and
   wherein each of the bit detectors includes:
   a set signal generator generating a second set signal that is activated when a corresponding bit of the counting address is the most significant high bit;
   a reset signal generator generating a reset signal according to a next upper bit of the corresponding bit of the counting address and a second initialization signal; and
   a second SR latch storing a corresponding search bit that is set according to the second set signal and reset according to the reset signal.

10. The semiconductor memory device of claim 8, wherein the masking control circuit includes:
    a plurality of comparators outputting a plurality of comparison bits by comparing the search bits with the bits of the active address, respectively; and
    a signal output part selectively deactivating the masking signal according to the comparison bits when the section control signal is a first logic level, and deactivating the masking signal regardless of the comparison bits when the section control signal is a second logic level.

11. The semiconductor memory device of claim 1, further comprising:
an address selection circuit outputting a row address by selecting one of the counting address and the input address according to a final refresh command provided from the refresh control circuit;
an active control circuit generating a row active signal according to the active command and the final refresh command; and
a row control circuit activating a word line corresponding to the row address according to the row active signal.

12. A memory system, comprising:
a memory controller transmitting a preset number of refresh commands and transmitting an input address with an active command, during a first refresh period and a second refresh period; and
a memory device generating a counting address sequentially increasing according to the refresh commands, generating an active address corresponding to the input address according to the active command, selectively refreshing one or more word lines, among a plurality of word lines, according to the counting address selected based on one or more high bits of the active address during the first refresh period, and sequentially refreshing the plurality of word lines according to the counting address during the second refresh period.

13. The memory system of claim 12, wherein the memory device repeatedly performs the first refresh period and the second refresh period according to the refresh commands.

14. The memory system of claim 12, wherein the memory device refreshes the one or more word lines corresponding to the counting address in which the most significant high bit corresponds to the high bit of the active address, and skips refreshing remainder of the plurality of word lines, during the first refresh period.

15. The memory system of claim 12, wherein the memory device includes:
a refresh counter, initialized according to a first initialization signal, for generating the counting address according to the refresh commands;
an active latch, initialized according to a second initialization signal, generating the active address having bits respectively corresponding to bits of the input address, and storing only a most significant high bit of the bits of the input address as a corresponding bit of the active address when the active command is inputted;
a masking decision circuit generating a section control signal for dividing the first refresh period and the second refresh period according to the refresh commands, and generating a masking signal by comparing the active address with the counting address according to the section control signal; and
a masking circuit outputting a final refresh command by selectively masking the refresh command according to the masking signal.

16. The memory system of claim 15,
wherein the active latch includes a plurality of unit latches corresponding to bits of the input address and storing bits of the active address, respectively, and
wherein each of the unit latches includes:
an input control unit generating an input control signal that is activated when a corresponding bit of the input address is a most significant high bit;
an input unit receiving the input control signal as a first set signal according to the active command; and
a first SR latch storing a corresponding bit of the active address, which is set according to the first set signal and reset according to the second initialization signal.

17. The memory system of claim 15, further comprising:
a first initialization part generating the first initialization signal according to a full-counting signal of the refresh counter; and
a second initialization part generating the second initialization signal when any one of the first initialization signal, a power-down signal or a reset mode signal is activated.

18. The memory system of claim 15, wherein the masking decision circuit includes:
a section control circuit generating the section control signal while changing a logic level of the section control signal when the number of the refresh commands reaches a predetermined number;
a bit search circuit generating a plurality of search bits corresponding to bits of the counting address, respectively, and storing a search bit corresponding to a most significant high bit of the bits of the counting address, as a high bit; and
a masking control circuit generating the masking signal by respectively comparing the search bits with bits of the active address according to the section control signal.

19. The memory system of claim 18,
wherein the bit search circuit includes a plurality of bit detectors corresponding to the bits of the counting address, respectively, and
wherein each of the bit detectors includes:
a set signal generator generating a second set signal that is activated when a corresponding bit of the counting address is the most significant high bit;
a reset signal generator generating a reset signal according to a next upper bit of the corresponding bit of the counting address and the second initialization signal; and
a second SR latch storing a corresponding search bit that is set according to the second set signal and reset according to the reset signal.

20. The memory system of claim 18,
wherein the masking control circuit selectively deactivates the masking signal according to a comparison result of the search bits with the bits of the active address when the section control signal is a first logic level, and
wherein the masking control circuit deactivates the masking signal when the section control signal is a second logic level.

21. An operating method of a memory system, comprising:
providing, at a memory controller, a preset number of refresh commands during a first refresh period;
generating, at a memory device, a counting address sequentially increasing according to the refresh commands, and refreshing one or more word lines, among a plurality of word lines, according to the counting address selected based on one or more high bits of an active address, during the first refresh period;
providing, at the memory controller, the preset number of refresh commands during a second refresh period; and
generating, at the memory device, the counting address sequentially increasing according to the refresh commands, and refreshing the plurality of word lines according to the counting address, during the second refresh period, wherein refreshing during the first refresh period and refreshing during the second refresh period are repeatedly performed.

22. The operating method of claim 21, wherein the memory device refreshes the one or more word lines corresponding to the counting address in which the most significant high bit corresponds to the high bit of the active address, and skips refreshing remainder of the plurality of word lines, during the first refresh period.

23. The operating method of claim 21, further comprising:
storing only a most significant high bit of bits of the input address in a corresponding unit latch when the active command is inputted,
wherein the memory device includes a plurality of unit latches corresponding to bits of an input address and storing bits of the active address, respectively.

24. The operating method of claim 21, further comprising:
initializing the counting address after the first refresh period or the second refresh period; and
initializing the active address when initializing the counting address, in a power-down mode, or in a reset mode.

* * * * *